United States Patent
Malladi et al.

(10) Patent No.: US 6,246,252 B1
(45) Date of Patent: Jun. 12, 2001

(54) EFFICIENT DEBUG PACKAGE DESIGN

(75) Inventors: Deviprasad Malladi, Campbell; Shahid Ansari, Milpitas; Hanxi Chen, San Jose; Bidyut Sen, Milpitas; Steven Boyle, Santa Clara, all of CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/364,563

(22) Filed: Jul. 30, 1999

(51) Int. Cl.[7] .......................... G01R 31/26; H01L 23/053
(52) U.S. Cl. ............................................. 324/765; 257/700
(58) Field of Search .................................. 324/765, 763, 324/761, 762, 764; 257/700

(56) References Cited

U.S. PATENT DOCUMENTS 5,499,445 * 3/1996 Boyle ................................... 257/700

* cited by examiner

Primary Examiner—Safet Metjahic
Assistant Examiner—James Kerveros
(74) Attorney, Agent, or Firm—John F. Schipper, Esq.

(57) ABSTRACT

A method for providing for electrical testing of an integrated semiconductor substrate having at least two signal processing layers. The substrate may be provided with a protective layer of plastic, silicon, silicon oxide, silicon nitride or the like. A selected region of one substrate layer to be tested electrically is exposed by etching or otherwise forming a controllably small aperture any overlying substrate layer(s) away to expose at least one selected circuit trace in the selected region and applying a selected electrical signal to the trace. Optionally, a second aperture, spaced apart from the first aperture, can be formed to expose a second selected circuit trace so that propagation of a signal in one or more substrate circuits can be tested. The aperture cross-sectional shapes may be linear or curvilinear polygons or other suitable shapes.

14 Claims, 6 Drawing Sheets

EFFICIENT DEBUG PACKAGE DESIGN

FIELD OF THE INVENTION

This invention relates to electronic testing of one or more layers of an integrated semiconductor circuit.

BACKGROUND OF THE INVENTION

Debugging of an array of flipchip devices, such as microprocessors and associated computer components implemented as integrated semiconductor circuits, is necessary to identify which devices are inoperative and the reason(s) for such device failures. One previous debug solution was to provide a large aperture in the flipchip package through which electronic probing could be performed. However, this now requires a full cut-out for the aperture, and any (power) solder bumps and circuit connections within the aperture become inoperative. Because of this lack of power-up, the chip cannot be tested or debugged at full speed.

What is needed is a device debugging approach that removes a minimal area aperture on a chip for signal testing or probing so that electrical power and continuity are not lost at solder bumps, circuit connections or other features within an aperture. Preferably, the location, shape and cross-sectional area of the aperture(s) should be flexible so that interference with a nearby circuit feature can be avoided or minimized, if desired.

SUMMARY OF THE INVENTION

These needs are met by the invention, which provides a plurality of small probe apertures in the semiconductor die, with locations strategically chosen to allow access to power core bumps and/or circuit connections that are part of the flipchip design. Any number of circuit layers, typically four or more, can be built up and tested for signal routing and power management. Circuit continuity and voltages at power points within a chip can be tested from a location outside the chip target region, using a socket or wire bond-flipchip connection to a package or to a substrate.

A protective coating or packaging material is preferably absent for the chip to be tested. However, a coating may be present, if the coating permits formation and resealing of small apertures therein for insertion of probe or test appliances. A controllably small aperture of arbitrary cross-sectional shape is etched or otherwise provided through one or more signal-processing layers of the chip to expose at least one circuit trace or electrical power solder bump at a target layer that is to be probed or otherwise tested. Optionally, two separated apertures can be provided so that a probe signal introduced at one point in a circuit is received and examined at another point in the circuit. The shape, size and location of the aperture can be chosen to minimize or avoid interference with provision of electrical power and/or electrical connections between circuit traces and components.

DESCRIPTION OF BEST MODES OF THE INVENTION

Figure 1:
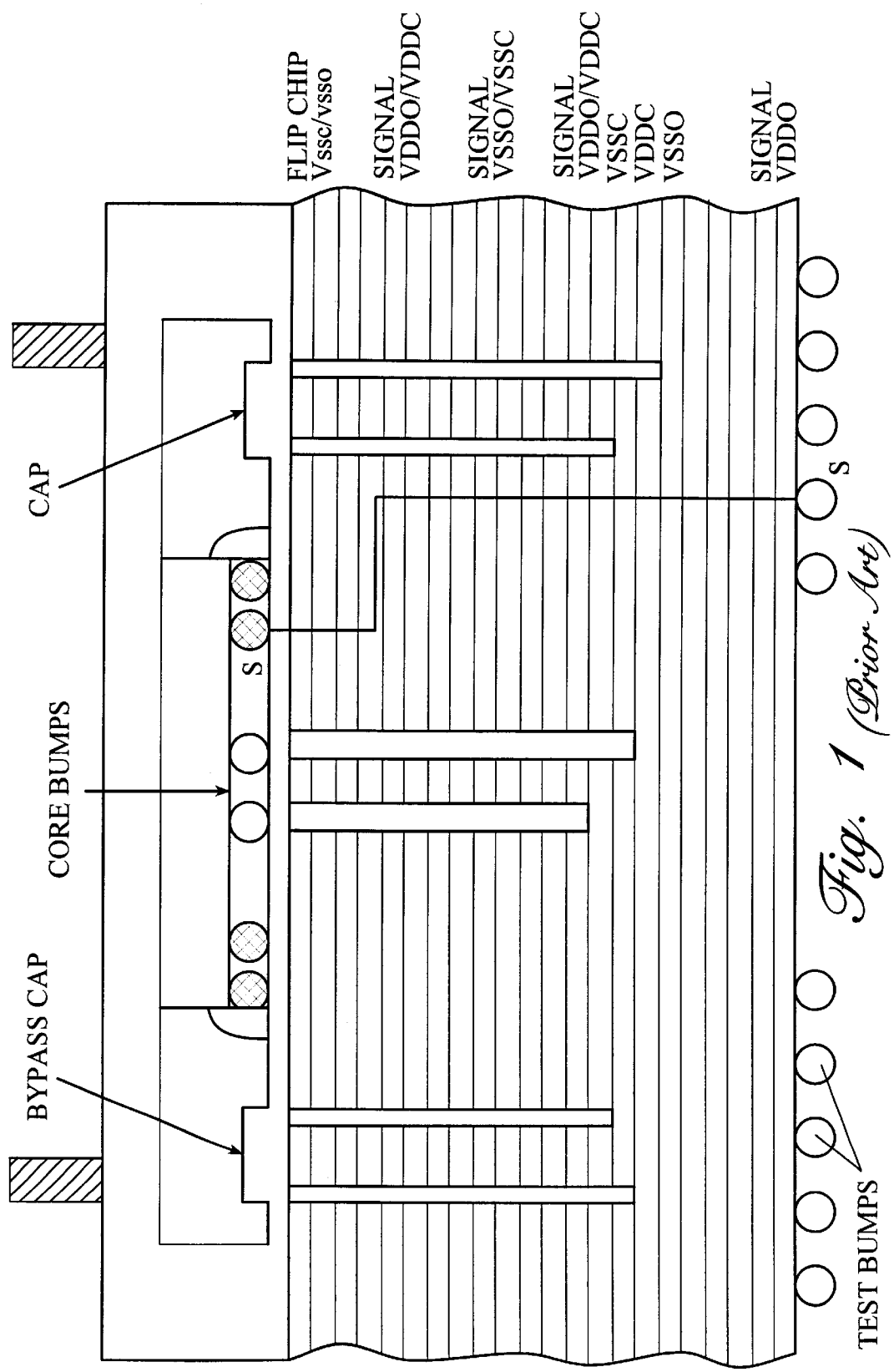
FIG. 1 (Prior Art) is a schematic view of a multilayered semiconductor circuit fabricated with a conventional approach.

FIG. 1 is a schematic view showing a multilayered semiconductor circuit fabricated with a conventional flipchip design, having one or more (solder) core bumps that are optionally connected to provide electrical power to, or to probe for responses to test signals that appear on, one or more internal layers of an integrated semiconductor circuit. One or more core bumps provides a voltage or current source and/or electrical ground for chip testing and/or operation.

In one version, most or all of the multilayer circuits are present within the bulk or interior of the substrate shown in FIG. 1. In an alternative and preferred version of the invention, most or all of the multilayer circuits are present in a thin film that is deposited on one or more surfaces of the substrate. Whether the circuits are in the interior of, or on the surface(s) of, the substrate, the test bumps must be connected to the core bumps, without breaks or gaps, in order to allow one or more useful electrical tests for the circuit.

Figure 2:
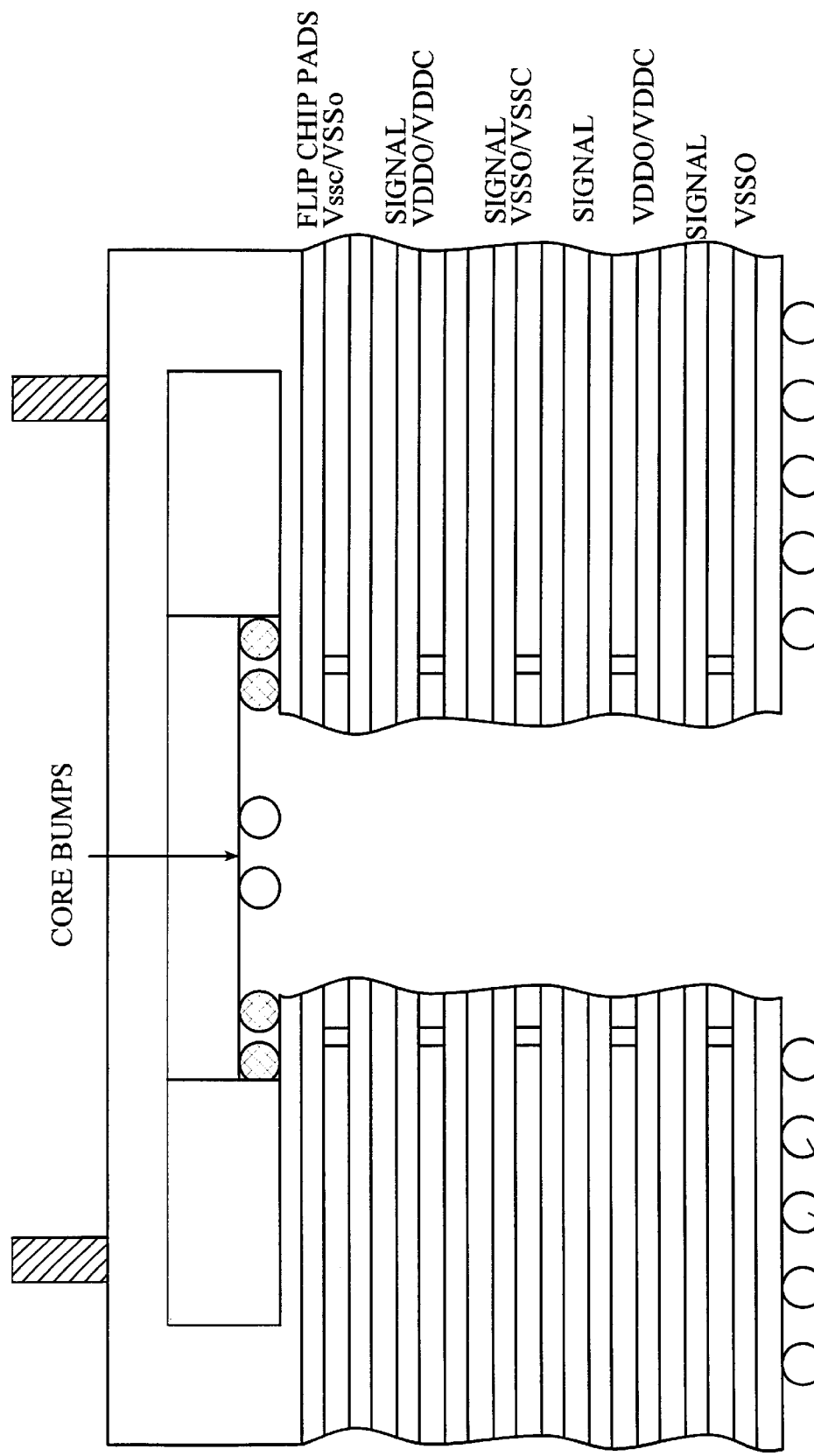
FIG. 2 (Prior Art) is a schematic view illustrating provision of the apparatus in FIG. 1 with a conventional debug package having a relatively large volume or area cut-out.

FIG. 2 illustrates a cut-out volume for signal testing or probing on a chip according to a conventional approach. The cut-out volume is a relatively large fraction, as much as 1–10 percent, of the local volume of the chip and often results in removal of one or more solder bumps that are used to provide voltage, current and/or electrical ground. Removal of such a large fraction of the local volume of the chip may also eliminate one or more electrical connections between two otherwise-connected locations on a chip circuit, thus interfering with one or more signal probes or tests on a given layer of the chip. Another problem here is that presence of a relatively hard substrate, such as a ceramic or another metallized material, often precludes placement of a cut-out volume in a convenient location.

Figure 3:
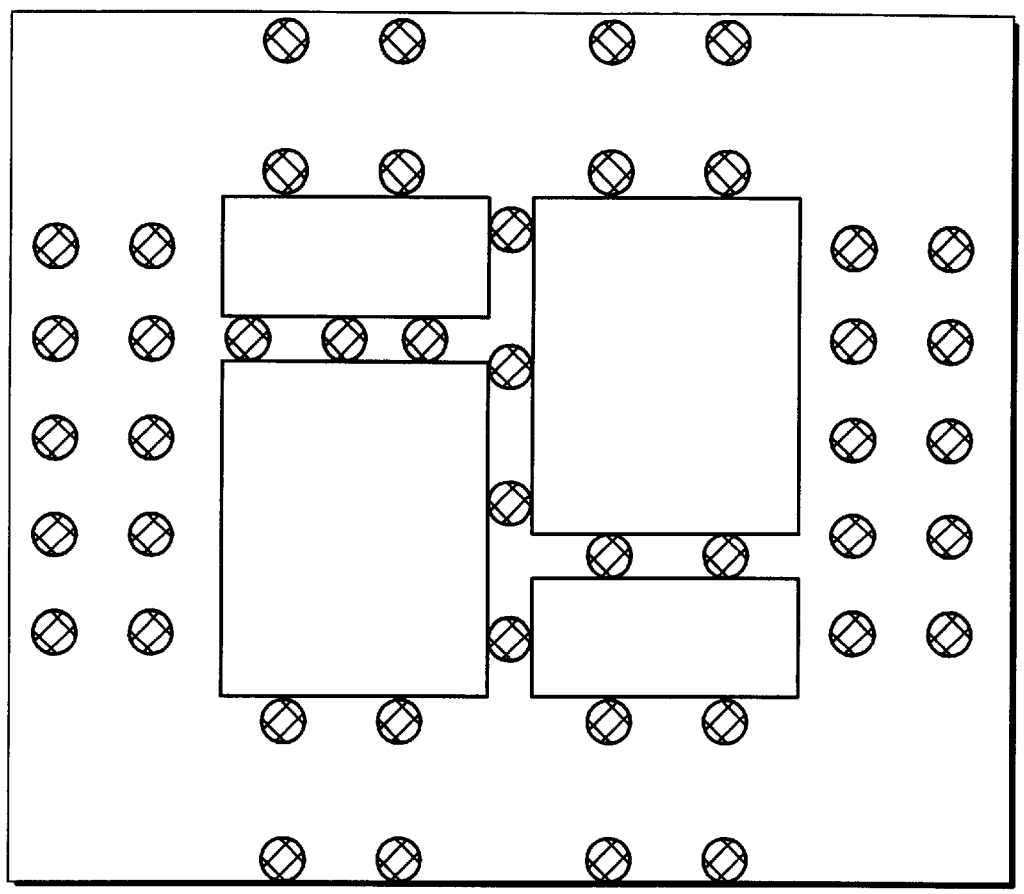
FIGS. 3 and 4 are a schematic top view and cutaway side view illustrating a semiconductor circuit fabricated for debugging according to the invention.

The invention etches or otherwise removes one or more small cylindrical volumes or apertures, with diameters in the range 0.01–3 mm, from a chip to expose a selected portion of the chip, down to and including a target layer of the chip, as indicated in FIG. 3. Preferably, the cross-sectional area A1 of the cylindrical volume that is removed lies in a range A1 of about $10^{-4}$–10 mm$^2$, but smaller or larger cross-sectional areas can be used here as well. One or more small chip apertures of a selected cross-sectional shape and area is etched or otherwise removed from overlying layers of the chip at a selected location to expose one or more traces of an electrical circuit in the target layer.

Figure 4:
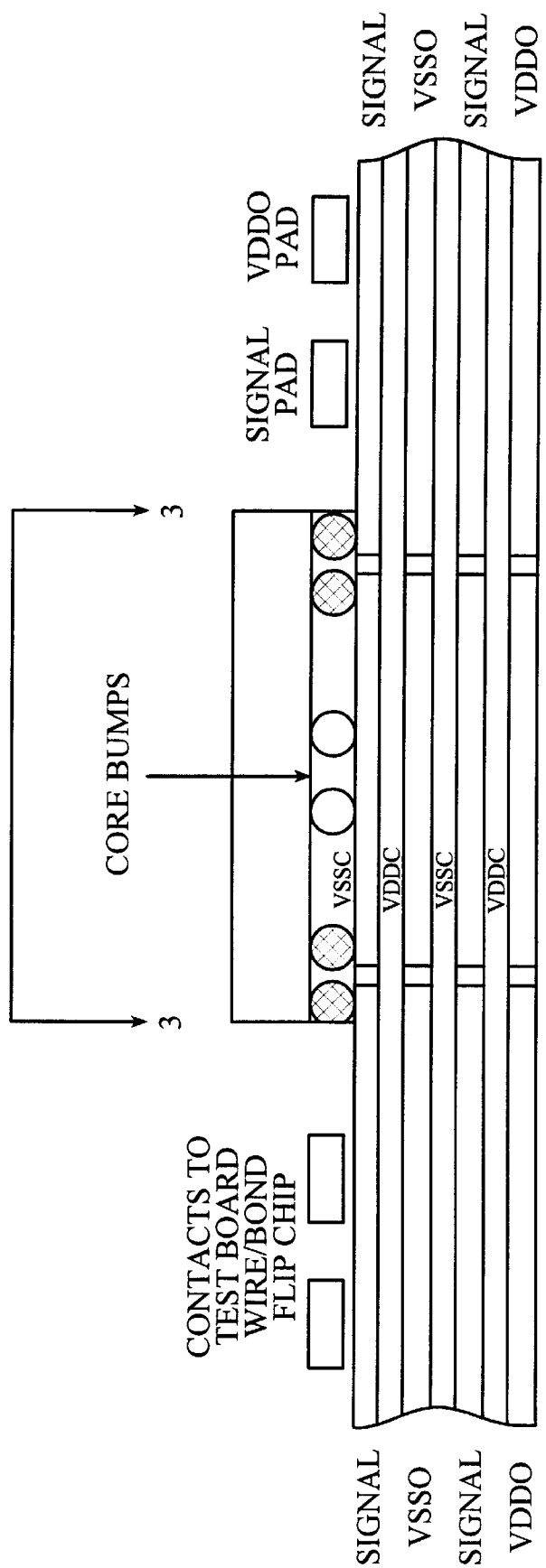
Figure 5A:
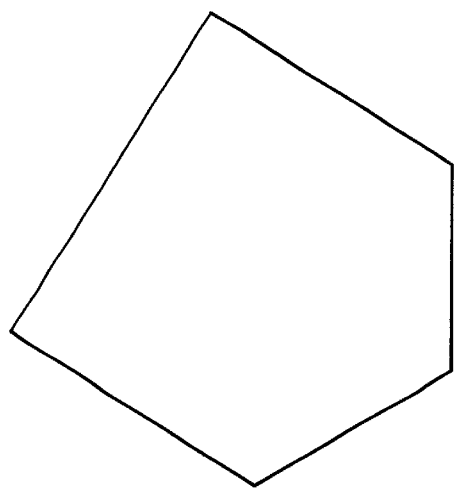
FIGS. 5A–5F illustrate suitable aperture cross-sectional shapes that may be etched in, or removed from, a protective silicon coating or substrate or one or more signal-processing layers of an integrated semiconductor chip according to the invention.
Figure 5B:
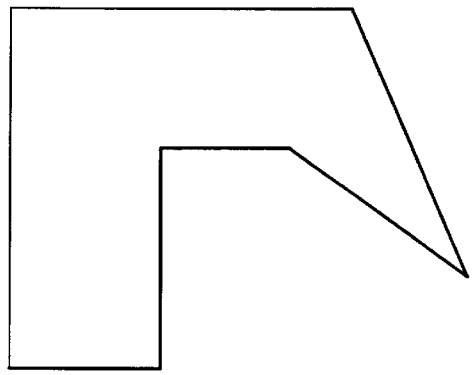
Figure 5C:
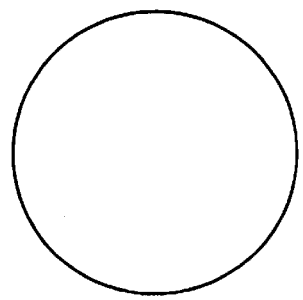
Figure 5D:
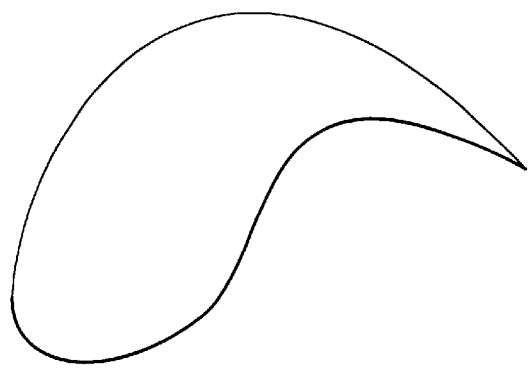
Figure 5E:
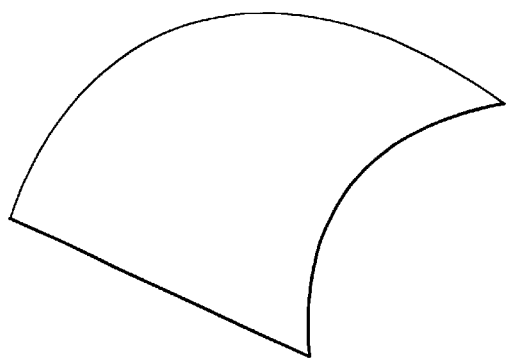
Figure 5F:
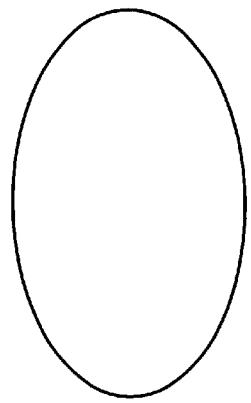

The cross-sectional shape of each removed cylinder may be rectangular, as illustrated in FIGS. 3 and 4, or may be another shape, and the diameter and shape of any two apertures may be different or the same. The shape and location of the chip aperture are preferably chosen to avoid, or minimize interference with, solder bumps and layer-to-layer electrical interconnections that provide voltage, current, electrical ground and circuit connections for the circuits within the chip. The cross-sectional shape of the chip aperture may be rectangular, as shown in FIG. 3, or may be convex polygonal, partially concave polygonal, circular, ovular, crescent-like or a combination of linear and curvilinear boundary lines, as illustrated in the examples in FIGS. 5A, 5B, 5C, 5D, 5E and 5F, respectively.

In many situations, it may be preferable to provide a second chip aperture, displaced from the first chip aperture and exposing the same target layer or another target layer of the chip. The result of introducing a probe or test signal into a circuit trace in the first target layer, can then be monitored at one or more circuit traces in the target layer exposed by the second chip aperture. The signal that appears on the second circuit trace can be monitored and compared with the probe or test signal for (1) differences in average voltage or peak-to-peak voltage, (2) differences in signal shape, (3) differences in time required to reach a peak of the signal at the first and second signal traces, (4) time delay between introduction of the probe or test signal at the first signal trace and this signal's appearance (possibly in altered form) at the second signal trace, (5) nonlinear effects associated with the probe or test signal, and (6) other qualitative or quantitative parameters of interest. A probe or test signal can also be used to determine the quantitative effects, if any, of variation of a voltage level including ground voltage, provided at one or more of the solder bumps associated with the chip.

An aperture of at-least-partly controllable size and shape can be formed by using any of several anisotropic etchants. However, different directions in bulk silicon will etch at different rates, and this anisotropy in etch rate should be accounted for in choosing etchant and an etch direction. Preferably, the etchant used should be highly anisotropic, with a longitudinal-to-transverse etch ratio of the order of 25:1 or higher. The (minimum) etch ratio needed may vary with the thickness of substrate to be removed to expose a circuit trace.

What is claimed is:

1. A method for providing for electrical testing of an integrated semiconductor substrate, the method comprising:
   providing a selected integrated semiconductor substrate having at least two signal processing layers;
   identifying a layer of the substrate and identifying a region on the identified substrate layer that is to be tested electrically;
   forming a selected aperture, having a selected cross-sectional area no larger than about 10 mm$^2$, in at least one layer of the substrate to expose at least a portion of the identified region on the identified layer of the substrate; and
   impressing an electrical signal on at least one circuit trace that is exposed in the identified region by the selected aperture in the substrate layer, and monitoring at least one electrical response to impression of the electrical signal on the at least one trace.

2. The method of claim 1, further comprising selecting said integrated semiconductor substrate to have no more than four signal processing layers.

3. The method of claim 1, further comprising selecting said area for said aperture to be no smaller than about $10^{-4}$ mm$^2$.

4. The method of claim 1, further comprising forming said aperture in said at least one layer of said substrate by using an etchant that is at least partly anisotropic.

5. The method of claim 4, further comprising selecting said anisotropic etchant to have a longitudinal-transverse etch ratio that is at least 25:1.

6. The method of claim 1, further comprising:
   forming a second selected aperture in said substrate, at a location that is spaced apart from said first selected aperture in said at least one layer of said substrate, to expose a selected second circuit trace; and
   introducing an electrical signal in said first circuit trace and monitoring an electrical response at the second circuit trace arising from introducing the electrical signal at said first circuit trace.

7. The method of claim 6, further comprising monitoring said electrical response at said second circuit trace for at least one of the following effects: (1) difference in average voltage at said first circuit trace and at said second circuit trace; (2) difference in peak-to-peak voltage at said first circuit trace and at said second circuit trace; (3) difference in signal shape at said first circuit trace and at said second circuit trace; (4) difference in time required for signal to reach a signal peak at said first circuit trace and at said second circuit trace; (5) time delay between introduction of said signal at said first circuit trace and appearance of said signal at said second circuit trace; (6) at least one nonlinear effect associated with amplitude of said signal that appears at said second circuit trace, after introduction of said signal at said first circuit trace.

8. The method of claim 6, further comprising forming at least one of said first aperture and said second aperture in said at least one layer of said substrate by using an etchant that is at least partly anisotropic.

9. The method of claim 1, further comprising choosing said selected aperture in said substrate to have a polygonal shape.

10. The method of claim 1, further comprising choosing said selected aperture in said substrate to have a rectangular shape.

11. The method of claim 1, further comprising choosing said selected aperture in said substrate to have at least one portion of a region boundary that is curvilinear.

12. The method of claim 1, further comprising choosing said selected aperture in said substrate to have at least one region boundary that is substantially circular.

13. The method of claim 1, further comprising choosing said selected aperture in said substrate to have at least one region boundary that is substantially ovular.

14. The method of claim 1, further comprising providing said at least two signal processing layers as a multi-layer thin film that is located on a selected portion of said substrate.

* * * * *